United States Patent [19]
Deming et al.

[11] Patent Number: 5,864,486
[45] Date of Patent: Jan. 26, 1999

[54] METHOD AND APPARATUS FOR IN-SYSTEM PROGRAMMING OF A PROGRAMMABLE LOGIC DEVICE USING A TWO-WIRE INTERFACE

[75] Inventors: Andrew S. Deming, Frederick, Md.; Daniel T. Gardner, Portland, Oreg.; James S. Larsen; Bertrand Leigh, both of Hillsboro, Oreg.

[73] Assignee: Lattice Semiconductor Corporation, Hillsboro, Oreg.

[21] Appl. No.: 643,291

[22] Filed: May 8, 1996

[51] Int. Cl.[6] .................................................. G06F 15/76
[52] U.S. Cl. ........................... 364/489; 364/488; 364/490
[58] Field of Search ..................................... 364/488, 489, 364/490, 491; 326/38–39; 375/222, 377; 379/93; 395/200.13, 200.61, 800.37

[56] References Cited

U.S. PATENT DOCUMENTS

| | | | |
|---|---|---|---|
| 5,336,951 | 8/1994 | Josephson et al. | 326/38 |
| 5,412,260 | 5/1995 | Tsui et al. | 326/39 |
| 5,473,758 | 12/1995 | Allen et al. | 711/103 |
| 5,583,885 | 12/1996 | Flynn et al. | 375/222 |
| 5,594,786 | 1/1997 | Chaco et al. | 379/93 |
| 5,619,544 | 4/1997 | Lewis et al | 375/377 |

*Primary Examiner*—Kevin J. Teska
*Assistant Examiner*—Vuthe Siek
*Attorney, Agent, or Firm*—Skjerven, Morrill, MacPherson, Franklin & Friel LLP; Edward C. Kwok; Hugh H. Matsubayashi

[57] ABSTRACT

Program data generated by the host system to be used in programming one or more associated ISPLDs is converted using a first interface from a parallel data format to a serial data string and then transmitted serially to a second interface. In one embodiment, the first and second interfaces employ Universal Asynchronous Receiver/Transmitter (UARTs). The receiving unit converts the serial program data string to a parallel data byte which is then provided to the programming pins of the ISPLD desired to be programmed. Signals indicative of information relating to the operation of one or more of the ISPLDs associated with the host system may be provided to the host system via pin SDO of the asserted ISPLD. In this manner, embodiments in accordance with the present invention may utilize a two-wire transmission scheme, and thus two-wire interfaces, to facilitate programming of the associated ISPLDs. Having the capability to utilize a two-wire transmission scheme, in turn, allows ISPLDs in accordance with the present invention to be programmed using wired transmission schemes such as, for instance, twisted pair and coaxial, as well as wireless transmission schemes, such as, for instance, radio frequency (RF) and infrared radiation (Ir).

14 Claims, 5 Drawing Sheets

METHOD AND APPARATUS FOR IN-SYSTEM PROGRAMMING OF A PROGRAMMABLE LOGIC DEVICE USING A TWO-WIRE INTERFACE

BACKGROUND OF THE INVENTION

1. Field of the Invention

The present invention relates to the design of programmable logic devices and, in particular, relates to the programming of programmable logic devices.

2. Discussion of the Related Art

Unlike a conventional programmable logic device, an in-system programmable logic device (ISPLD) may be reprogrammed in its application without removal from the circuit board. Some ISPLD devices, such as those available from Lattice Semiconductor Corporation, Hillsboro, Oreg., can be reprogrammed using an operating power supply rather than a high programming voltage. The method of reprogramming an ISPLD in place is known in the art as in-system programming (ISP). FIG. 1 shows an idealized pin-out of a typical ISPLD 5. As shown in FIG. 1, ISPLD 5 comprises a number of input-only pins ($I_1, I_2, \ldots, I_n$), a number of programmable input/output pins ($I/O_1, I/O_2, \ldots, I/O_m$), power (VCC) and ground (GND) pins, and a set of four ISP pins (SDI, SDO, SCLK, and MODE).

To reprogram ISPLD 5 using ISP, a host system including a microprocessor or microcontroller and a signal source (which is well known and thus not shown for simplicity) converts the desired programming parameters into a JEDEC file using a design tool such as Synario/pDS available from Lattice Semiconductor Corporation. This JEDEC file is then converted to a binary file such as, for instance, an ispSTREAM file using software such as JED2ISP Conversion Utility available from Lattice Semiconductor Corporation. In response to this ispSTREAM file, an isp signal source provides programming data and programming control signals to ISPLD 5 at pins SDI, SCLK, and MODE, respectively, and receives signals from ISPLD 5 indicative of, for instance, programming verification or self-test at pin SDO. Typically, where for example the host system is a PC-based machine, an 8-bit parallel port serves as the interface between the host system and ISPLD 5. In such cases, where only four of the 8-bits of the parallel port are utilized, ISPLD 5 is said to employ a four-wire interface.

In the ISP mode, a state machine within ISPLD 5 having numerous states takes over control of the programming activities. Programming data generated by the host system is input serially into the program memory of ISPLD 5 over the serial input pin SDI via the parallel interface. The rate of serial input is 1-bit per clock period. A clock signal is provided on pin SCLK when the ISP mode is entered. Each ISPLD 5 can, in a mode operation referred to as Flowthrough mode, provide on its output pin SDO data received from its serial input pin SDI. In this manner, a number of ISPLDs 5 may be "daisy-chained" together by tying the serial input pin SDI of one ISPLD 5 to the serial output pin SDO of another ISPLD 5. Any ISPLD 5 in the daisy chain can be re-programmed by providing the new program to the serial input pin SDI of the first ISPLD 5, where the data is then provided to the ISPLD 5 desired to be programmed by shifting the data through intervening ISPLDs 5 (which are placed in Flowthrough mode) in the daisy chain.

In-system programming techniques for ISPLDs employing a four-wire ISP parallel interface such as ISPLD 5 are discussed further in U.S. Pat. Nos. 4,855,954 (entitled "In-System Programmable Logic Device with Four Dedicated Terminals", to Turner et al, issued Aug. 8, 1989), 4,761,768 (entitled "Programmable Logic Device", to Turner et al, issued Aug. 2, 1988), and 4,896,296 (entitled "Programmable Logic Device Configurable I/O Cell", to Turner et al, issued Jan. 23, 1990).

More recent ISPLDs reduce total pin overhead by employing only one dedicated programming pin, e.g., the in-system programming or ispEN pin. When an enabling signal associated with the ispEN pin is asserted, this ISPLD enters a programming mode. The additional in-system programming pins (SDI, SDO, SCLK, and MODE) referred to above are made available by multiplexing pins which are normally, i.e., when not in programming mode, input/output pins. In-system programming may thus be implemented at the cost of only a single dedicated pin. For a more detailed explanation of programming techniques using only one dedicated programming pin ispEN, see U.S. Pat. No. 5,237,218 (entitled "Structure and Method for Multiplexing Pins for In-System Programming", to Josephson et al, issued Aug. 17, 1993), hereby incorporated by reference. Note that when ISPLDs having a dedicated programming pin ispEN are in a programming state, the use of five pins (ispEN, SDI, SDO, SCLK, and MODE) are required. Accordingly, such ISPLDs require a five-wire interface.

It is thus desirable to implement a system capable of providing program data to and receive response data from a PLD using a two-wire transmission means. In this manner, transmission techniques such as standard telephone lines and wireless communications may be employed to remotely program the ISPLD.

SUMMARY

A structure and a method to implement programming of an in-system programmable logic device using only a two-wire interface is disclosed. In accordance with the present invention, program data generated by the host system to be used in programming one or more associated ISPLDs is converted using a first interface from a parallel data format to a serial data string and then transmitted serially to a second interface receiving unit. In one embodiment, the first and second interfaces employ Universal Asynchronous Receiver/Transmitter (UARTs). The receiving unit converts the serial program data string to a parallel data byte which is then provided to the programming pins of the ISPLD desired to be programmed. Signals indicative of information relating to the operation of one or more of the ISPLDs associated with the host system such as, for instance, device self-tests and verification of programming may be provided to the host system via pin SDO. Thus, embodiments in accordance with the present invention may utilize a two-wire transmission scheme, and thus two-wire interfaces, to facilitate programming of the associated ISPLDs. Having the capability to utilize a two-wire transmission scheme, in turn, allows ISPLDs in accordance with the present invention to be programmed using wired transmission schemes such as, for instance, coaxial and twisted pair as well as wireless transmission schemes such as for instance radio frequency (RF) and infrared radiation (Ir).

DETAILED DESCRIPTION

Figure 1:
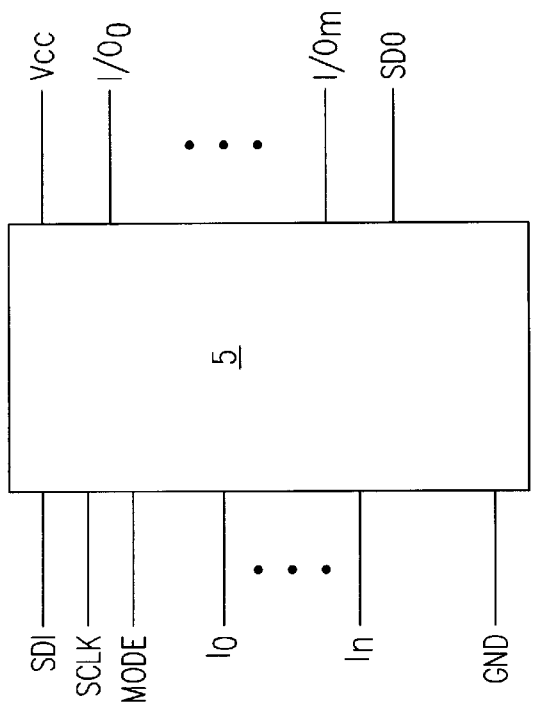
FIG. 1 is an idealized pin-out diagram of a conventional in-system programmable logic device (ISPLD) having dedicated programming pins SDI, SDO, SCLK, and MODE.

Embodiments in accordance with the present invention are discussed below in the context of an ISPLD configured in a manner consistent to use five ISP signals during programming (i.e. ISP enable, serial data in, serial data out, mode, and shift clock) at associated respective pins ispEN, SDI, SDO, MODE, and SCLK. It is to be noted, however, that those skilled in the art will, after reading the disclosure below, be readily able to apply the teachings herein to ISPLDs utilizing a different number of ISP programming signals and/or pins during programming, such as, for instance, the four-wire ISPLD 5 of FIG. 1. Further, it is to be understood that the ISPLD 40 shown in FIG. 2 and discussed below is representative of any suitable PLD, including those employing EPROM, EEPROM, and Flash memory cells. For convenience, those elements common to various illustrative embodiments discussed below are similarly labelled.

Figure 2:
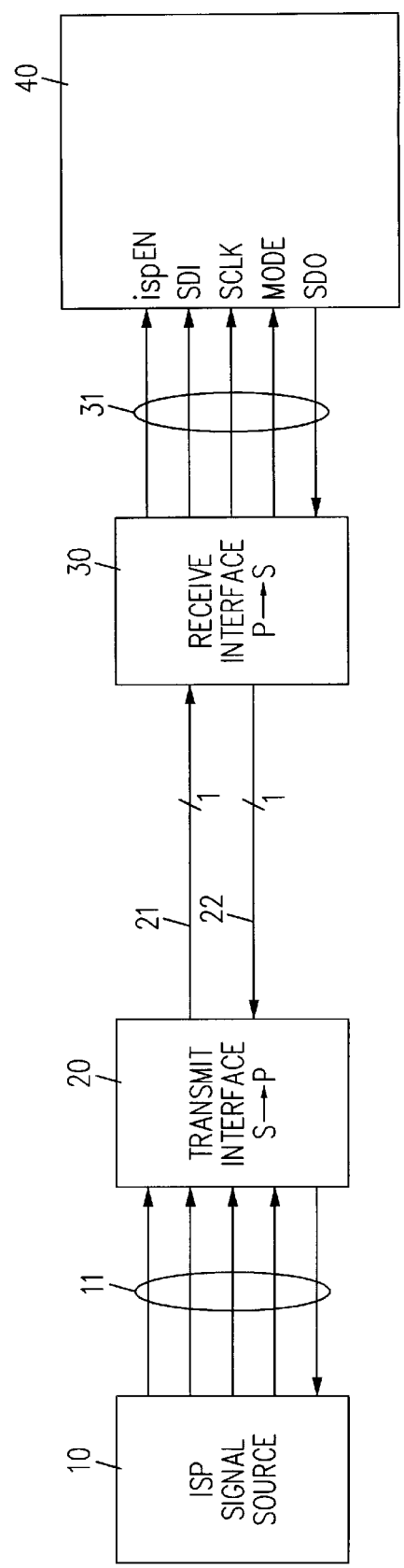
FIG. 2 is a block diagram of an interface system including an ISPLD in accordance with one embodiment of the present invention.

Referring now to FIG. 2, an ISP signal source 10 contained in a suitable host system such as, for instance a PC or UNIX machine generates the programming signals associated with pins ispEN, SDI, SCLK, and MODE of an ISPLD 40 in a well known manner. These signals are provided in parallel format e.g. a parallel byte to an interface 20 via a five-wire interface bus 11 which may in other embodiments include a greater number of wires. Interface 20 converts this parallel byte to a half duplex or full duplex serial data string, and then transmits this serial data string to a half duplex or full duplex interface 30 via one line 21 of a two-wire serial transmission interface 21, 22. For convenience, emulation code used in one embodiment for converting parallel data to serial data is provided in an Appendix attached hereto. Interface 30, in turn, receives the serial string and converts the serial data string into parallel form and, in this manner, provides the ISP programming signals to respective pins ispEN, SDI, SCLK, and MODE of ISPLD 40 via five-wire interface bus 31, which in other embodiments may include a greater number of wires.

Signals indicative of information relating to the operation of ISPLD 40 such as for instance device self-tests and verification of programming may be provided from ISPLD 40 to interface 30 as serial data on pin SDO. Interface 30 converts the serial data string associated with pin SDO of ISPLD 40 into a serial format consistent with that employed in transmitting data from interface 20 to interface 30 via wire 21. This conversion ensures that data may be transmitted from both interface 20 to interface 30 and from interface 30 to interface 20 according to the same transmission protocol. Once converted, this serial data string indicative of the signals at pin SDO is transmitted to interface 20 via another line 22 of the aforementioned serial transmission interface 21, 22. Once received by interface 20, the serial data stream is converted to parallel format and provided to signal source 10 via bus 11.

Thus, unlike conventional programming schemes for ISPLDs which require a transmission means having a minimum of four or five wires, the above described embodiment allows ISPLD 40 to be programmed and/or reprogrammed using only a two-wire transmission scheme. Present embodiments, by allowing ISPLDs 40 to be programmed and/or reprogrammed using a two-wire transmission scheme, are thus able to take advantage of not only various superior two-wire serial transmission schemes such as coaxial, ethernet, conventional phone lines, and fiber optics but also wireless transmission schemes such as infrared and RF. Further, two-wire transmission schemes in accordance with the present invention reduce the programming interface pin overhead on the PLD while allowing for increased programming flexibility (i.e., programming via network, remote programming via telephone, etc., and wireless programming of a system where physical connections between the host system and ISPLD 40 are not feasible).

In some embodiments, interfaces 20 and 30 each employ a Universal Asynchronous Receiver/Transmitter (UART). Signals to be provided to ISPLD 40 may be transmitted between interfaces 20 and 30 according to the RS-232C standard transmission protocol which requires a start bit, 8 data bits, and one stop bit, although other serial transmission protocols may be used. Interfaces 20 and 30 also include a well-known logic circuit which detects when data is received, pauses a predetermined amount of time before transmitting data, and commences the transmission of data. This logic circuit may be in the form of a discrete logic circuit attached to the UART, or in some embodiments may be an ISPLD from Lattice Semiconductor which has been programmed or integrated into a circuit to implement such transmission protocol control functions.

In other embodiments, interfaces 20 and 30 may include an Intel 8051 microprocessor having built-in UART capabilities. Employing an 8051 processor in such a manner allows interfaces 20 and 30 to implement additional functions such as variable transmission rates for multiple interfaces. Note that in yet other embodiments other well-known techniques may be employed in interfaces 20 and 30 to convert parallel data into a serial data string and to convert a serial data string into parallel data.

Figure 3A:
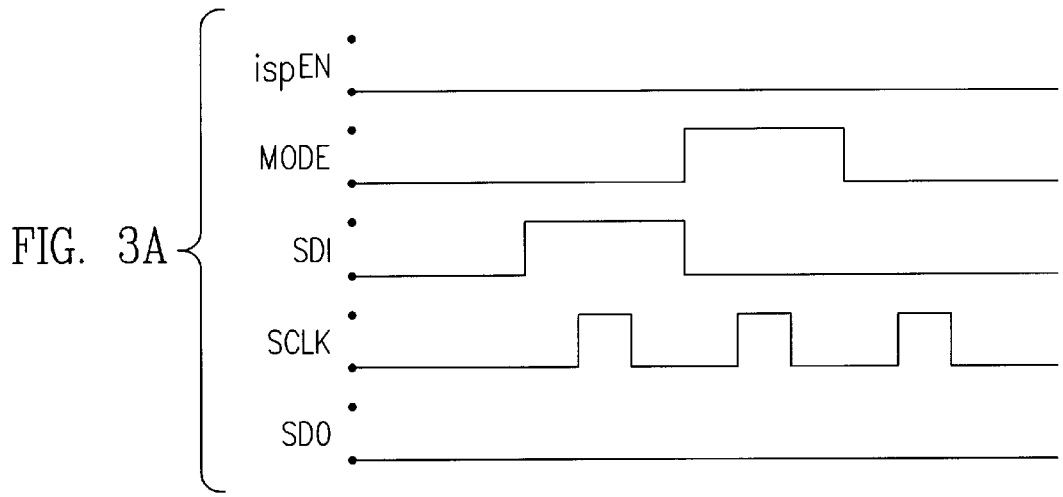
FIGS. 3A and 3B are timing diagrams illustrating signals associated with various programming pins of an ISPLD during the transmission of serial data to an ISPLD and the reception of serial data from an ISPLD in accordance with the present invention, respectively.
Figure 3B:
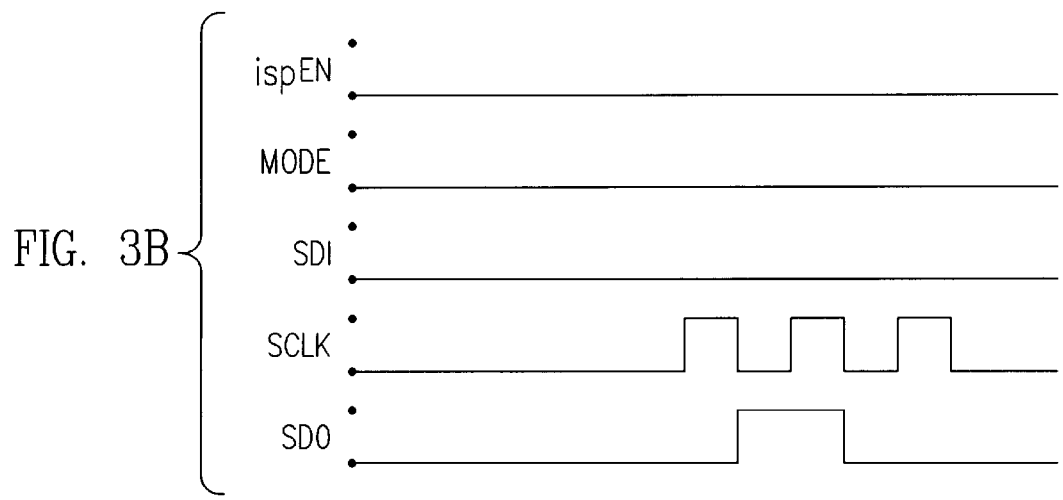

When programming ISPLD 40, programming data generated by signal source 10 is grouped into data strings for serial transmission by interface 20. For each possible transition on one of the programming pins ispEN, SDI, SDO, SCLK, and MODE, a corresponding data string is loaded into a serial shift register within interface 20 and then serially transmitted to interface 30. In response thereto, interface 30 captures the data string and latches the data string in its parallel register. The time delay typically associated with latching the programming data in the parallel register allows ISPLD 40, or in some embodiments an attached daisy chain of ISPLDs 40, to respond to the signals associated with the next program data string. Data indicative of ISPLD 40's current status such as, for instance, self-test results or programming verification, is provided to interface 30 by ISPLD 40 via pin SDO. Interface 30 converts this data to a serial data stream and transmits this data stream to the host system, e.g., signal source 10, in a manner consistent with that discussed above. Once the data is received at the host system, signal source 10 causes the next segment of data to be transmitted to ISPLD 40. The timing diagrams shown in FIGS. 3A and 3B illustrate the relationship between the signals associated with pins ispEN, MODE, SDI, SCLK, and SDO when transmitting and receiving, respectively, serial data. FIG. 3A illustrates segmenting parallel data for serial transmission to ISPLD 40, where the signals on pins MODE and SDI are clocked by the signal on pin SCLK. FIG. 3B illustrates segmenting parallel data from ISPLD 40 for serial transmission back to signal source 10 for verification. The data on pins SDO is clocked by the signal on pin SCLK.

In some embodiments, interface 30 may be implemented within ISPLD 40, thereby eliminating the need for a serial controller on the board associated with ISPLD 40. In such embodiments, ISPLD 40 would require a serial port, a serial to parallel register, a parallel to serial register, and a well-known logic circuit to control the transmission of data signals to and from interface 20.

Figure 4:
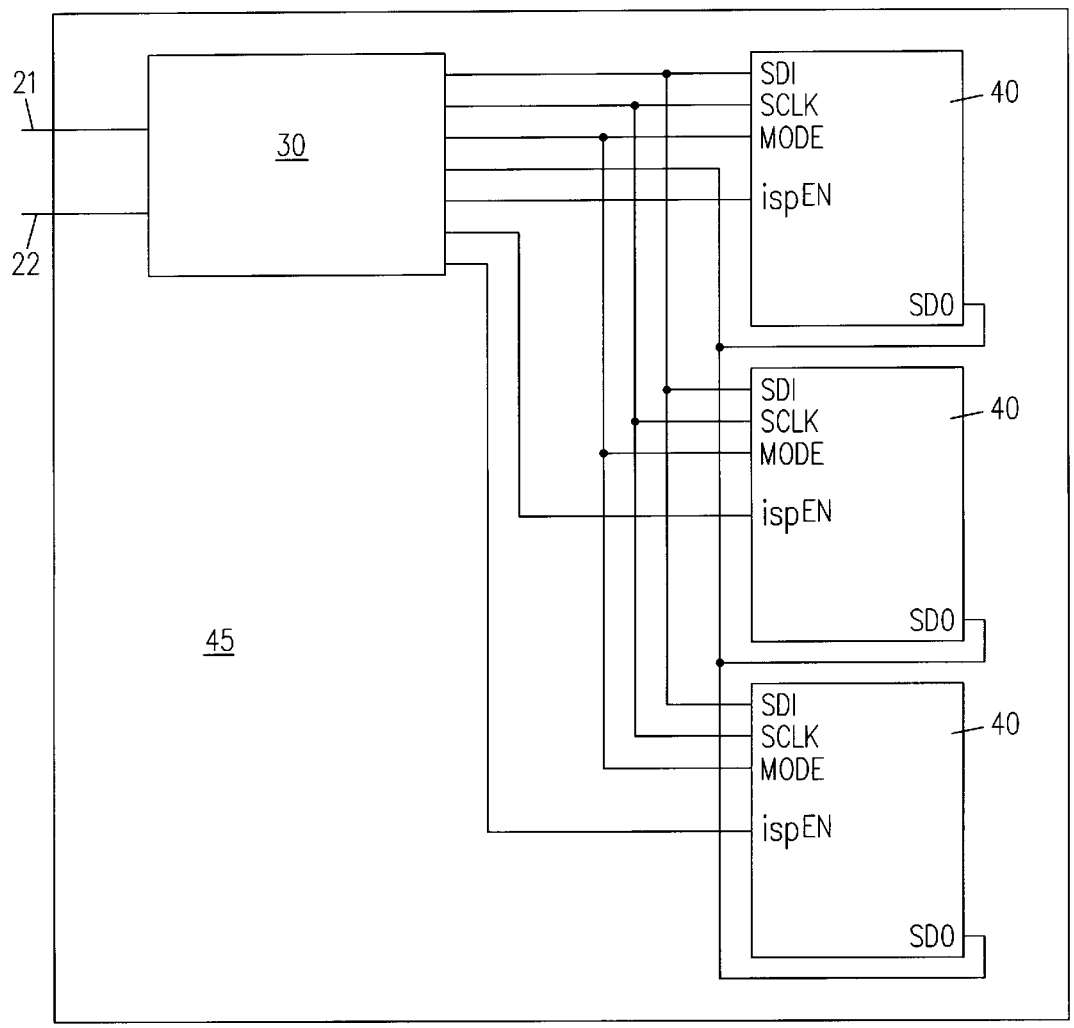
FIGS. 4–8 are block diagrams illustrating various programming schemes in accordance with the present invention.

Numerous ISPLDs 40 contained on a single board may be independently programmed by individually selecting and enabling each of the ISPLDs 40. FIG. 4 shows such a board 45 containing interface 30 and three ISPLDs 40. Interface 30 may employ a standard 8-bit port to connect with the programming pins of the three ISPLDs 40 contained on board 45, where only seven of the eight pins of the parallel port are used: four of the eight bits of the parallel port are connected to each of respective pins SDI, SDO, MODE, and SCLK of the three ISPLDs 40, and three of the eight bits of the parallel port are individually connected to the ispEN pin of an associated one of ISPLDs 40, as shown in FIG. 4, so that each of ISPLDs 40 may be individually enabled for programming via its ispEN pin. The remaining pin of the parallel port may be used to enable a fourth ISPLD 40 (not shown) on board 45 or, in other embodiments, may be reserved for other suitable purposes. Thus, in those embodiments where interface 30 includes 8 wires, e.g., employs an 8-bit parallel port, up to four different ISPLDs 40 may be addressed by the host system. In some embodiments, where for instance five different ISPLDs 40 are addressed, the parallel port definition may be as follows:

TABLE 1

| pin number | pin assignment | | |
|---|---|---|---|
| | send | receive | description |
| 0 | SDI/TDI | | serial data in/text data in |
| 1 | MODE/TMS | SDO/TDO | control mode/test mode select for sending data to ISPLD 40; serial data out/test data out for receiving data from ISPLD 40 |
| 2 | SCLK/TCK | | serial clock/test clock |
| 3 | ispEN0 | | enable first ISPLD 40 for ISP |
| 4 | ispEN1 | | enable second ISPLD 40 for ISP |
| 5 | ispEN2 | | enable third ISPLD 40 for ISP |
| 6 | ispEN3 | | enable fourth ISPLD 40 for ISP |
| 7 | ispEN4 | | enable fifth ISPLD 40 for ISP |

The terminology TDI, TMS, TDO, and TCK is common to JTAG and Boundary Scan Test Access Port (TAP) used for in-system programming, and is therefore provided in Table 1 for clarity and convenience. Note that any of the pins listed above in Table 1 may be used for both sending and receiving data, as illustrated above by pin 1.

Note that in embodiments where it is desired to individually select ISPLDs 40 on a single board, the programming software operating within the host device must be updated. A sample algorithm which may be used by the programming software operating in the host system is provided below. It is to be understood that this algorithm provided below is illustrative and that other suitable methods may be employed.

```
FOR x=1 to 3
    IF X=1
        Set port(xxxx100x)
        Program Device #1;
    IF X=2
        Set port(xxxx010x)
        Program/Verify Device #2;
    IF X=3
        Set port(xxxx001x)
        Program/Verify Device #3;
NEXT;
```

Figure 5:
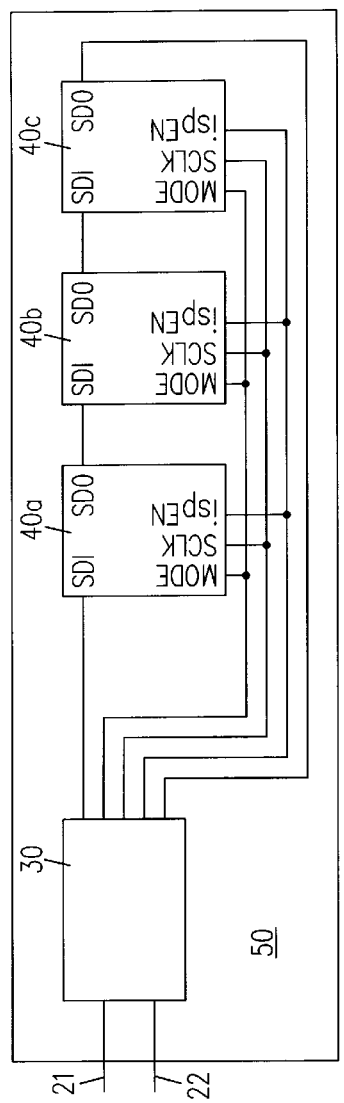

A daisy chain of ISPLDs 40 may be programmed using the above described serial interfaces in conjunction with software such as ispCODE.C or ispCODE.EXE available from Lattice Semiconductor Corporation. FIG. 5 shows a board 50 including a daisy chain of three ISPLDs 40*a*–40*c* and interface 30, although in actual embodiments a greater or fewer number of ISPLDs 40 may be included on board 45. Note that ISPLDs 40*a*–40*c* are identical to ISPLD 40 discussed above. Three of the pins of interface 30 are connected to respective pins SCLK, MODE, and ispEN of ISPLDs 40*a*–40*c*. A fourth pin of interface 30 is connected to the SDI pin of the first ISPLD 40*a*. The SDO pin of ISPLD 40*a* is connected to the SDI pin of ISPLD 40*b*, the SDO pin of ISPLD 40*b* is connected to the SDI pin of ISPLD 40*c*, and the SDO pins of ISPLD 40*c* is connected to a fifth pin of interface 30. Where interface 30 includes an eight-bit parallel port, the remaining three bits may be used for controlling multiple daisy chains of ISPLDs 40. Accordingly, when programming a daisy chain such as that shown in FIG. 5 in accordance with the present invention, the parallel port definition of interface 30 must be changed from that shown in Table 1 to a well-known standard parallel format.

Where it is desired to program one or more of ISPLDs 40*a*–40*c*, the signal associated with the ispEN pins of ISPLDs 40 is asserted so as to enable all ISPLDs 40 in the daisy chain. The first ISPLD 40*a* is then addressed and programmed as described above while remaining ISPLDs 40*b* and 40*c* are held in a Flowthrough or Bypass mode. When in Flowthrough mode, the SDI/TDI pin of ISPLD 40 is connected directly to its SDO/TDO pin. When in Bypass mode, the SDI/TDI pin of ISPLD 40 is connected to the input terminal of an edge triggered D-type register (not shown for simplicity) and the SDO/TDO pin of the ISPLD 40 is connected to the output terminal of the D-type register. Flowthrough and Bypass modes may be enabled either by a specific instruction provided to ISPLD 40 or by a combination of signals provided on the programming pins of ISPLD 40. After having been programmed, the first ISPLD 40*a* in the daisy chain is placed in Flowthrough or Bypass mode while the second ISPLD 40*b* in the daisy chain is programmed, and so on until all ISPLDs 40*a*–40*c* in the daisy chain have been programmed.

In other embodiments, multiple ISPLDs 40 may be programmed in parallel to reduce programming time. In such embodiments, the programming software operating within the host system must support parallel programming. For example, software such as DDOWNLD.EXE, WDOWNLD.EXE, ispATE.EXE and ispCODE.EXE (collectively known in the industry as Turbo programming) available from Lattice Semiconductor Corporation supports parallel programming and may thus be used. When programming a daisy chain of multiple ISPLDs 40 in parallel, the daisy chain of ISPLDs 40 is treated as a single device. During programming, each of the ISPLDs 40 in the daisy chain is clocked to a shift state. A Data Shift command is then provided to ISPLDs 40, after which programming data for ISPLDs 40 is sequentially clocked into the data registers of ISPLDs 40 via their respective SDI pins. The ISPLDs 40 then enter the Data Shift State. The Program Data command is then clocked into the ISPLDs 40 of the daisy chain, after which the ISPLDs 40 enter the Execute state. A clock pulse asserted on pin SCLK causes data stored in the shift registers of ISPLDs 40 to program the EEPROM cells within ISPLDs 40, thereby reprogramming ISPLDs 40. The required programming pulse width time delay is applied to transfer sufficient electrons to the floating gate of the EEPROM cell. Once the required programming pulse width time delay (TPWP) has been applied, a clock pulse to halt programming and clock back to the Shift State is asserted. This process continues until the entire daisy chain of ISPLDs 40 is programmed.

Figure 6:
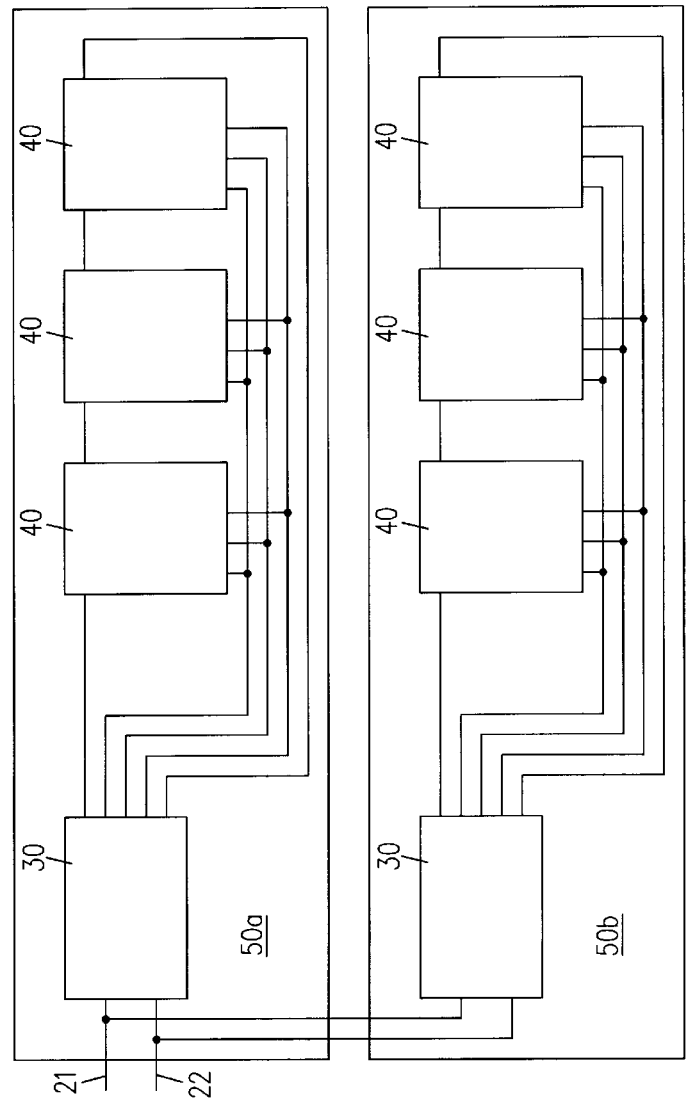

Multiple boards 50a, 50b each including interface 30 and a chain of ISPLDs 40 may be coupled to one another as shown in FIG. 6 and programmed in accordance with the present invention. Note that although discussed below with reference to FIG. 6, the teachings of the present invention may be easily adapted to simultaneously program a greater number of connected boards 50 each having a fewer or greater number of ISPLDs 40. Each interface 30 shown in FIG. 6 includes a well-known decoder logic circuit which, upon detecting that its assigned address code has been asserted by the host system, enables its internal serial controller (not shown for simplicity) for programming. The enabled interface 30 then facilitates programming of ISPLDs 40 associated therewith. Those interfaces 30 not addressed by the host system are disabled and therefore inactive. Once ISPLDs 40 associated with the enabled interface 30, e.g. board 50a, have been programmed, the host system disables that interface 30 and then addresses interface 30 associated with another board, e.g., board 50b, thereby allowing programming of another corresponding daisy chain of ISPLDs 40.

Figure 7:
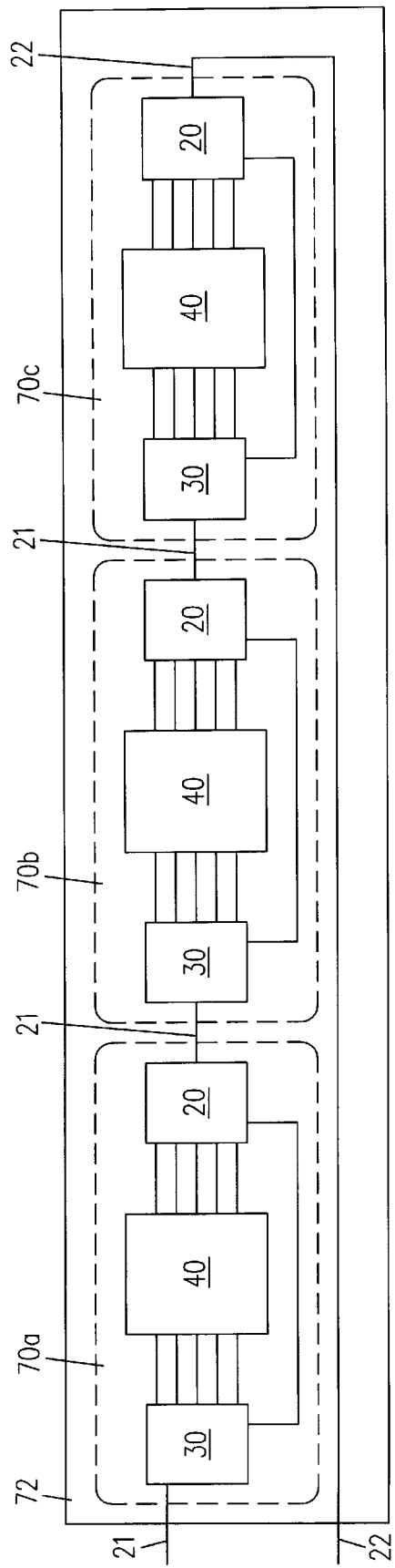

Multiple devices including interfaces 20, 30 and ISPLD 40 may be connected in a serial fashion and programmed in accordance with the present invention. FIG. 7 shows three such devices 70a–70c formed on a board 72, where two-wire serial transmission interface 21, 22 is connected to and provides programming signals to a first one of devices 70a via its interface 30. This interface 30 is connected to an associated ISPLD 40 in the manner described above with respect to FIG. 2. Thus, although shown in FIG. 7 to employ a five-wire configuration in connecting interface 30 to the programming pins of ISPLD 40 of board 70a, it is to be understood that a configuration having a greater number of wires, such as, for instance, a standard 8-bit parallel port, may be employed.

Figure 8:
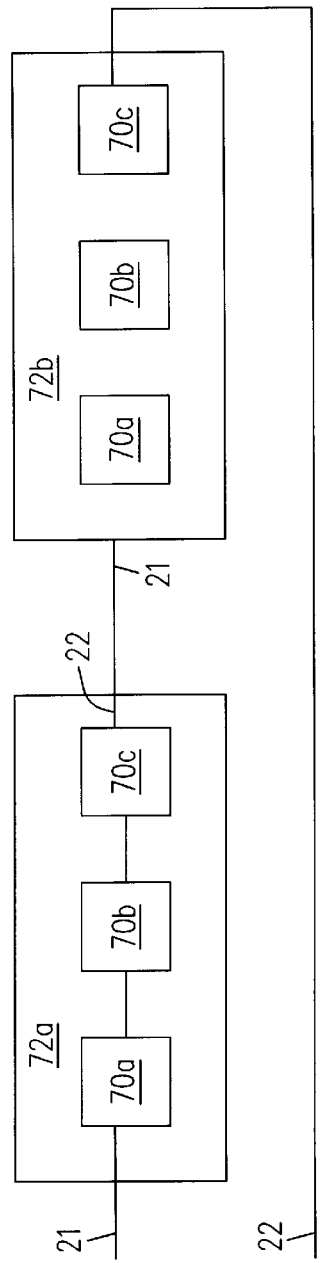

When programming ISPLDs 40 shown in the embodiment of FIG. 7, the host system provides programming data to interface 30 of board 70a as discussed above with respect to FIG. 2. The serial program data string is received by this interface 30, converted to parallel format, and provided to its associated ISPLD 40. After a specific time delay, the associated ISPLD 40 transmits the program data in parallel to its associated interface 20 which, as discussed above, converts the program data to a serial data string. Once converted to a serial string, the program data is transmitted via single wire 21 to a second one of devices 70b, where the serial string is received and converted to parallel format by its interface 30. Data indicative of each of ISPLDs 40 current status, such as, for instance, self-test results or programming verification is provided to the host device via wire 22. Although board 72 is shown in FIG. 7 to include only three of devices 70a–70c, board 72 may in actual embodiments include a greater or fewer number of devices 70. Further, any number of boards 72 may be connected together, as shown, for instance, in FIG. 8, and programmed as discussed above.

In each of the embodiments described above, the transmission of serial data from the host system to a board containing ISPLDs 40, as well as the transmission of data between such boards, has been described in the context of a two-wire interface 21, 22 for illustrative purposes only. In actual embodiments, the transmission of serial programming data may be implemented in accordance with any one of numerous transmission schemes.

In some embodiments, a direct physical connection is made between the host computer and PC board containing one or more ISPLDs 40. This physical connection may be, for instance, a twisted pair which allows for two-wire testing and programming of ISPLD(s) 40 provided on the board, thereby saving valuable pin resources of ISPLD(s) 40 provided on the board.

Transmitting serial data in a manner consistent with a two-wire transmission scheme advantageously allows phone lines to be used in such transmissions. Referring, for instance, to FIG. 2, modems may be coupled in a well-known manner to interfaces 20 and 30, thereby allowing programming data to be used in programming ISPLD 40 to be transmitted over long distances using phone lines rather than transmission wires 21, 22. This feature is especially useful in remote environments, such as when field upgrading a board or system of ISPLDs 40.

Wireless transmission schemes may also be used instead of two-wire serial transmission interface 21, 22, shown, for instance, in FIG. 2. When using Radio Frequency (RF) as a transmission technique, the programming data is modulated with a carrier signal in a well-known manner and then transmitted to a receiver unit coupled to a board containing the ISPLDs 40 desired to be programmed.

Infrared (IR) technology may also be used in accordance with the present invention to transmit program data from the host system to a board containing ISPLDs 40 desired to be programmed. IR transmission of program data may be implemented by simply coupling an Infrared Data Association (IrDA) standards compliant transmitter to the host system and coupling an IrDA standards compliant receiver to the board in a well-known manner. The IrDA transmitter may be initialized by the host system and the IrDA receiver may be initialized by a well-known logic circuit coupled thereto. As long as both the receiver and transmitter are initialized to utilize the same data transmitter rate, other wireless transmission protocols may be employed.

While particular embodiments of the present invention have been shown and described, it will be obvious to those skilled in the art that various changes and modifications may be made without departing from this invention in its broader aspects and, therefore, the appended claims encompass all such changes and modifications as fall within the true spirit and scope of this invention.

| Appendix: Serial Programming Interface Emulation Code |

```
MODULE uart
Title    IR ISP Project rev 6.0
         Dan Gardner
         Applications Engineer
         Lattice Semiconductor Corporation
         Aprii 30, 1996'
"NOTES:
"REV 6.0 is for sales demo device
"To run at 115,200 baud use a 7.3728MHz clock and divider is 64
"Inputs
         CLOCK           pin;                              "Main Clock
         RXD             pin 97;                           "Serial data in
"Outputs
         SDI             pin 98 ISTYP 'reg_d';             "iSP SDI
         SCLK            pin 95 ISTYPE 'reg_d";            "ISP SCLK
         MODE            pin 94 ISTYPE 'reg_d';            "ISP MODE
         ISPEN           pin 93 ISTYPE 'reg_d';            "ISP ISPEN
         D_C             pin 90 ISTYPE~ 'reg_d';           "Data or Control mode of CS8130
         CS8130_RESET    pin 96 ISTYPE 'reg_d';            "Reset pin of CS8130
         CS8130_CLK      pin 83 ISTYPE 'reg_d';            "Clock for CS8130
         PCLK            node ISTYPE 'reg_d';              "PT Clock for shift register
         OUTCLK          node ISTYPE 'reg_d';              "PT Clock for parallel ISP output
         SR0 . . . SR7   node ISTYP~ 'reg_d';              "Shift register, SR7=MSB and SR0=LSB
         STOP            node ISTYPK 'reg_d';              "SR stop bit
         TXD             pin 91 ISTYPE 'reg_d';            "Serial data out and SR Start bit
         C9 . . . C0     node ISTYPE 'reg_d';              "Clock divider counter
         BS2 . . . BS0   node ISTYPE 'reg_d':              "Initiaiization counter
"State Variabies
         SV0 . . . $V3   node ISTYPE 'buffer reg_d';       "State machine counter
         COUNTRESET      node ISTYPE 'reg_d';              "Clock divider reset
"Declarations
         COUNT = [C9 . . . C0]:                            "Define clock divider counter
         INITCOUNT = [BS2 . . . BS0];                      "Define init. counter
         SR = [STOP, SR7 . . . SR0, TXD];                  "Define 10-bit serial shift register
         BRD = 61;                                         "Baud rate divider (115, 200)
         INITBRD = 766;                                    "Baud rate divider (9600)
         GETD = 60;                                        "BRD-1 for data capture
         INITD = 765;                                      "INITBRD-1 for data capture
         HALF = 29;                                        "Half a serial cycle
         X, C = .X., .C.;
"State Declarations
         sreg =          [SV0, SV1, SV2, SV3];
         Reset =         [0, 0, 0, 0];
         Init =          [0, 0, 0, 1];
         Send =          [0, 0, 1, 0];
         Wait1 =         [0, 0, 1, 1];
         Check_Start =   [0, 1, 0, 0];
         Bit0 =          [0, 1, 0, 1];
         Bit1 =          [0, 1, 1, 0];
         Bit2 =          [0, 1, 1, 1];
         Bit3 =          [1, 0, 0, 0];
         Bit4 =          [1, 0, 0, 0];
         Bit5 =          [1, 0, 1, 0];
         Bit6 =          [1, 0, 1, 1];
         Bit7 =          [1, 1, 0, 0];
         Stop_Bit =      [1, 1, 0, 1];
         Undef1 =        [1, 1, 1, 0];
         Undef2 =        [1, 1, 1, 1];
Equations
         sreg.clk = COUNTRESET;                            "Clock State machine with a fast Clock
         OUTCLK.clk = CLOCK;                               "Clock ISP output clock with a fast clock
         PCLK.clk = CLOCK;                                 "Clock SR clock with a fast clock
         COUNT := (COUNT + 1) & (sreg != Wait1);           "Simple counter
         COUNT.clk = CLOCK;                                "at fast clock
         COUNT.ar = COUNTRESET;                            "allow PT reset
         COUNTRESET.d    = (COUNT == BRD) & (D_C)
                         # (COUNT == INITBRD) & (!D_C)
                         # (COUNT == INITBRD) & (sreg == Reset)
                         # (COUNT == PLALF) & (sreg == Check_Start)
                         # (RXD == 0) & (D_C) & (sreq == Wait1);
         COUNTRESET.CLK  = CLOCK;                          "Clock reset register with a fast clock
         INITCOUNT := (INITCOUNT + 1) & (!D_C)
                    # [1, 1, 0] & (D_C);
         INITCOUNT.clk = OUTCLK;
         D_C := (INITCOUNT == 6);
         D_C.CLK = CLOCK;
         CS8130_RESET := (sreg != Reset);
         CS8130_RESET.clk = CLOCK;
```

| Appendix: Serial Programming Interface Emulation Code |
|---|

```
            CS8130_CLK.d = !CS8130_CLK.q;
            CS8130_CLK.clk = CLOCK;
            SDI.d          = SR0.q & (D_C);              "ISP output definition from software
            SDI.clk        = OUTCLK;
            SCLK.d         = SR1.q & (D_C);
            SCLK.clk       = OUTCLK;
            MODE.d         = SR2.q & (DC);
            MODE.clk       = OUTCLK;
            ISPEN.d        = SR3.q & (D_C)
                           # (!D_C);
            ISPEN.clk      = OUTCLK;
"Shift register definition with parallel load
            STOP.d         = RXD & (D_C) & (sreg != (Init # Reset));
            STOP.clk = PCLK;
            SE7.d          = STOP.q & (sreg != (Init # Reset));
            SR7.clk        = PCLK;
            SR6.d          = SR7.q & (sreg !=#(Init # Reset));
            SR6.Clk        = PCLK;
            SR5.d          = SR6.q & (sreg != (Init # Reset));
            SR5.clk        = PCLK;
            SR4.d          = SR5.q & (sreg != (Init # Reset));
            SR4.clk        = PCLK;
            SR3.d          = SR4.q & (sreg != (Init # Reset));
            SR3.clk        = PCLK;
            SR2.d          = SR3.q & (sreg != (Init # Reset));
            SR2.clk        = PCLK;
            SR1.d          = SR2.q & (sreg != (Init # Reset)),
            SR1.clk        = PCLK;
            SR0.d          = SR1.q & (sreg != (Init # Reset));
            SR0.clk        = PCLK;
            TXD.d          = (SR0.q & (sreg != (Init # Reset)))
                           # (D_C)
                           # (INITCOUNT == 5) & (sreg == Stop_Bit);
            TXD.clk        = PCLK;
state_diagram sreg:
            state Undef1:
                        goto Wait1;
            state Undef2:
                        goto Wait1;
            state Reset:
            TXD.d = 1;
            when COUNT == 700 then PCLK.d = 1;
            goto Init;
            state Init.:           "Initialize CS8130 registers
                        when (INITCOUNT == 0) then SR.d = [1, 0, 0, 0, 0, 0, 0, 1, 1, 0];
                        when (INITCOUNT == 1) then SR.d = [1, 0, 1, 0, 0, 0, 0, 1, 1, 0];
                        when (INITCOUNT == 2) then SR.d = [1, 0, 1, 1, 0, 0, 0, 1, 0, 0];
                        when (INITCOUNT == 3) then SR.d = [1, 1, 0, 0, 1, 0, 0, 0, 0, 0];
                        when (INITCOUNT == 4) then. SR.d = [1, 1, 0, 0, 0, 0, 0, 0, 1, 0];
                        when (INITCOUNT =~ 5) then SR.d = [1, 0, 0, 0, 1, 0, 0, 0, 1, 0];
                        when COUNT == INITD then PCLK.d = 1;
                        if (!D_C) then Send
                        else Wait1;
            state Send:
                   when COUNT == INITD then PCLK.d = 1;
                        goto Bit0;
            state Wait1:                                  "Wait for a start bit
                   if (KXD == 0) THEN Check_start=;
                   else Wait1;                   "Got Start bit
            state Check_Start:                            "False bit detection
                   if (RXD == 1)
                   then Wait1 else                        "false start bit
                   BjtO;                                  "good start bit
            state Bit0:                                   "capture serial data
                   when (COUNT == GETD) & (D_C)
                        #(COUNT == INITD) & (!D_C) then PCLK.d = 1;
                   goto Bit1;
            state Bit1:
                   when (COUNT == GETD) & (D_C)
                        #(COUNT == INITD) & (!D_C) then PCLK.d = 1;
                   goto Bit2;
            state Bit2:
                   when (COUNT == GETD) & (D_C)
                        #(COUNT == INITD) & (ID_C) then PCLK.d = 1;
                   goto Bit3;
            state Bit3:
                   when (COUNT == GETD) & (D_C)
                        #(COUNT == INITD) & (!D_C) then PCLK.d = 1;
```

Appendix: Serial Programming Interface Emulation Code

```
            goto Bit4
    state Bit4:
            when (COUNT == GETD) & (D_C)
                #(COUNT == INITD) & (!D_C) then PCLK.d = 1;
            goto Bit5;
    state Bit5:
            when (COUNT == GETD) & (D_C)
                #(COUNT == INITD) & (!D_C) then PCLK.d = 1;
            goto Bit6;
    state Bit6:
            when (COUNT == GETD) & (D_C)
                #(COUNT == INITD) & (!D_C) then PCLK.d = 1;
            goto Bit7;
    state Bit7:
            when (COUNT == GETD) & (D_C)
                #(COUNT == INITD) & (!D_C) then PCLK.d = 1;
            goto Stop_Bit;
    state Stop_Bit:
            when (COUNT == GETD) & (D_C) then PCLK.d = 1;          "Clock SR
            when (COUNT == BRD) & (D_C) then OUTCLK.d = 1;         "Clock ISP regs
            when (COUNT == INITD) & (!D_C) then OUTCLK-d = 1;      "Clock INITCOUNT
            if D_C then Wait1                                       "Wait for next serial byte
            else Init;                                              "Send next init byte
```

We claim:

1. A system for programming a programmable logic device, comprising:

a host system receiving input data and providing output data in parallel;

a first interface having a parallel port connected to said host system to receive from said host system said output data and to provide to said host system said input data, said first interface having a serial port, said first interface converting said output data into a first serial bit stream, providing said first serial bit stream for output by said serial port and receiving said input data in a second serial bit stream received at said serial port; and a second interface having a serial port, coupled to receive said first serial bit stream from said serial port of said first interface and to provide said second serial bit stream to said serial port of said first interface, said second interface converting said first serial bit stream received at said serial port of said second interface to parallel input signals of programming pins of said programmable logic device, and converting one or more output signals of said programming pins of said programmable logic device to said second serial bit stream.

2. The system of claim 1, wherein said serial port of said first interface and said serial port of said second interface are coupled by a coaxial line.

3. The system of claim 1, wherein said serial port of said first interface and said serial port of said second interface are coupled by a twisted pair line.

4. The system of claim 1, wherein said serial port of said first interface and said serial port of said second interface are coupled by an ethernet line.

5. The system of claim 1, wherein said serial ports of said first and second interfaces are coupled by a modem.

6. The system of claim 1, wherein said first and second serial bits streams are transmitted between first and second interfaces using radio frequency (RF).

7. The system of claim 1, wherein said first and second serial bit streams are transmitted between said first and second interfaces using infrared radiation (IR).

8. The system of claim 1, wherein said first interface comprises an asynchronous receiver/transmitter unit (UART).

9. A method for programming a programmable logic device, said method comprising the steps of:

generating output programming data and receiving input programming data in a host system, said input and output programming data being provided in parallel form;

converting said output programming data into a first serial data stream, and receiving said input programming data from a second serial data stream according to a parallel-to-serial conversion protocol;

transmitting said first serial data stream and receiving said second serial data stream through a first interface;

receving said first serial data stream and transmitting said second serial data stream through a second interface;

converting said first serial data stream into parallel programming data according to a serial-to-parallel conversion protocol and applying said parallel programming data to programming pins of said programmable logic device; and receiving one or more output signals from said programmable logic device and converting said output signals into said second serial data stream.

10. The method of claim 9, wherein communication between said first and second interfaces are provided over a twisted pair line.

11. The method of claim 9, wherein communication between said first and second interface are provided over a coaxial line.

12. The method of claim 9, wherein communication between said first and second interfaces are provided over an ethernet line.

13. The method of claim 9, wherein communication between said first and second interfaces are provided over radio frequency (RF).

14. The method of claim 9, wherein communication between said first and second interfaces are provided by infrared radiation.

* * * * *